United States Patent [19]
En

[11] Patent Number: 6,048,761
[45] Date of Patent: Apr. 11, 2000

[54] METHOD FOR MANUFACTURING A SEMICONDUCTOR DEVICE WITH SELF-ALIGNED PROTECTION DIODE

[75] Inventor: William G. En, Sunnyvale, Calif.

[73] Assignee: Advanced Micro Devices, Inc., Sunnyvale, Calif.

[21] Appl. No.: 09/301,690

[22] Filed: Apr. 29, 1999

Related U.S. Application Data

[62] Division of application No. 08/798,993, Feb. 11, 1997, Pat. No. 5,900,664.

[51] Int. Cl.⁷ .................................................. H01L 21/8234
[52] U.S. Cl. .......................................... 438/237; 438/738
[58] Field of Search .................................... 438/737, 237, 438/741, 238, 380, 381, 738, 740, FOR 220, FOR 415

[56] References Cited

U.S. PATENT DOCUMENTS

| | | | |
|---|---|---|---|
| 5,587,598 | 12/1996 | Hatanaka | 257/355 |
| 5,602,410 | 2/1997 | Schwalke et al. | 257/401 |
| 5,641,991 | 6/1997 | Sakoh | 257/755 |
| 5,672,895 | 9/1997 | Iida et al. | 257/357 |
| 5,705,437 | 1/1998 | Wu et al. | 438/238 |
| 5,710,076 | 1/1998 | Dai et al. | 438/305 |
| 5,808,365 | 9/1998 | Mori | 257/775 |
| 5,899,749 | 5/1999 | Becker et al. | 428/714 |

OTHER PUBLICATIONS

Zheng et al., "A Quick Experimental Technique In Estimating The Cumulative Plasma Charging Current with MOSFET and Determining The Reliability of The Protection Diode In The Plasma Ambient", 1996 1$^{st}$ International Symposium on Plasma Process–Induced Damage (IEEE Cat. No. 96TH8142), May 1996, pp. 27–29.

H.C. Shin et al., "Thin gate oxide damage due to plasma processing", Semiconductor Science and Technology, Apr. 1996, vol. 11, No. 4, pp. 463–473.

H. Shin et al., "Impact of Plasma Charging Damage and Diode Protection on Scaled Thin Oxide", International Electron Devices Meeting 1993, IEEE Cat. No. 93CH3361–03, 1993, pp. 467–470.

M.C. Chang et al., "Degradation of MOS Transistor Characteristics by Gate Charging Damage During Plasma Processing", International Symposium on VLSI Technology, Systems, and Applications, IEEE Cat. No. 93TH0524–9, 1993, pp. 320–324.

Primary Examiner—Carl Whitehead, Jr.
Assistant Examiner—Jamie L. Davis

[57] ABSTRACT

A self-aligned protection diode is formed at the first polycrystalline silicon level, thereby enabling in-process charging damage protection while reducing the layout area. The self-aligned protection diode is formed by providing an etch stop layer having an arcuate portion with different etching characteristics than horizontal portions, isotropically etching the arcuate portion to form a through hole exposing a side surface of a polycrystalline silicon layer and the underlying semiconductor substrate, ion implanting impurities to form the protection diode, and filling the through hole with a metal interconnecting the side surface of the polycrystalline silicon layer with the vertically self-aligned protection diode.

18 Claims, 4 Drawing Sheets

METHOD FOR MANUFACTURING A SEMICONDUCTOR DEVICE WITH SELF-ALIGNED PROTECTION DIODE

This application is a divisional of application Ser. No. 08/798,993 filed Feb. 11, 1997 U.S. Pat. No. 5,900,664.

TECHNICAL FIELD

The present invention relates to a semiconductor device comprising a protection diode, and to a method of manufacturing the semiconductor device. The present invention is particularly applicable for producing semiconductor devices with increased density and improved reliability.

BACKGROUND ART

During conventional semiconductor processing, plasma techniques are routinely employed, particularly in manufacturing Very Large Scale Integrated (VLSI) devices. Such conventional plasma techniques comprise etching various films, including polycrystalline silicon, oxides and metals. Plasma techniques are also conventionally employed for oxide deposition, sputter pre-clean prior to physical vapor deposition, and photoresist stripping during ion implantation. During such plasma processing, devices fabricated on silicon wafers are usually directly exposed to the plasma. Such plasma exposure is known to cause degradation of the gate oxides in MOS devices attributed to electrical charging during the plasma process.

In the plasma ambient, metal or polycrystalline silicon electrodes serve as antennas, thereby collecting ions and electrons during plasma processing. A steady state voltage appears on the electrode due to charge collection and the resulting electrical stress is capable of destroying the underlying gate electrode by oxide breakdown or weakening it by causing charge trapping in the oxide as well as interface trap generation at the silicon dioxide-silicon interface. Since the damaged oxide may cause IC yield loss or become more vulnerable to hot-carrier induced degradation and time-dependent dielectric breakdown, plasma-induced gate oxide degradation constitutes a serious problem in VLSI technology. See, for example, Zheng et al., "A Quick Experimental Technique In Estimating The Cumulative Plasma Charging Current with MOSFET and Determining The Reliability of The Protection Diode In The Plasma Ambient," 1996 1st International Symposium on Plasma Process-Induced Damage (IEEE Cat. No. 96TH8142), 1996, pp. 27–29; H. C. Shin et al., "Thin gate oxide damage due to plasma processing," Semiconductor Science and Technology, April 1996, Vol. 11, No. 4, pp. 463–473; H. Shin et al., "Impact of Plasma Charging Damage and Diode Protection on Scaled Thin Oxide," International Electron Devices Meeting 1993, IEEE Cat. No. 93CH3361-03, 1993, pp. 467–470; and M. C. Chang et al., "Degradation of MOS Transistor Characteristics by Gate Charging Damage During Plasma Processing," International Symposium on VLSI Technology, Systems, and Applications, IEEE Cat. No. 93TH0524-9, 1993, pp. 320–324.

As integration increases and feature size for devices decrease, the thickness of gate oxide layers decreases, thereby exacerbating the adverse impact of plasma charging damage. A conventional approach to the plasma charging damage problem comprises the formation of a protection diode to which the polycrystalline silicon layer, i.e., gate electrode/word line, is connected, thereby providing a discharge path for electrical charging during plasma processing. For example, adverting to FIG. 6, a conventional semiconductor device containing a protection diode comprises substrate 60, such as P-doped silicon, a field oxide shallow trench isolation insulating layer comprising sections 61, and polycrystalline silicon layer 62 formed thereon with a gate oxide layer 63 separating polycrystalline silicon layer 62 from semiconductor substrate 60. Insulating sidewall spacers 64 are formed along side surfaces of polycrystalline silicon layer 62, and a dielectric interlayer 65 is formed thereon. Metal interconnect line 66 electrically connects and, thereby, provides a discharge path between polycrystalline silicon layer 62 and protection diode 67 formed in the semiconductor substrate doped with an N-type impurity.

The conventional structure depicted in FIG. 6 is formed by methodology illustrated in FIGS. 7 and 8. As to FIGS. 6 through 8, similar elements bear similar reference numerals. Adverting to FIG. 7, N-type protection diode 67 is formed by ion implantation, as indicated by arrows 70, typically during ion implantation to form source/drain regions. Subsequently, as shown in FIG. 8, dielectric interlayer 65 is deposited, and through holes 80A and 80B are formed therein, as by anisotropic etching. Through hole 80A exposes an upper surface of polycrystalline silicon layer 62, while through hole 80B exposes a portion of protection diode 67. Subsequently, a layer of metal, typically tungsten, is deposited and etched to form metal interconnect line 66, as shown in FIG. 6, electrically interconnecting polycrystalline silicon layer 62 and protection diode 67.

Conventional practices with respect to a protection diode, such as that illustrated in FIGS. 6 through 8, are attendant with numerous disadvantages, particularly in requiring extra layout area, thereby increasing the total die size and hindering miniaturization. As a result of the consequential increase in precious chip real estate, protection diodes are sparingly used, being reserved for only the most critical areas of the circuit, typically devices connected to bond pads. Accordingly, there exists a need to provide a semiconductor device with a protection diode with minimal or no adverse impact on layout area, thereby enabling the liberal use of protection diodes throughout an integrated circuit.

DISCLOSURE OF THE INVENTION

An object of the present invention is a semiconductor device comprising a protection diode with no or minimal increase in layout area.

Another object of the present invention is a method of manufacturing a semiconductor device comprising a protection diode which can be employed throughout an integrated circuit with no or minimal increase in layout area.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a substrate containing an impurity of a first conductivity type; an isolation insulating layer formed in the semiconductor substrate; a conductive layer, having first and second side surfaces, formed on the isolation insulating layer; an ion implanted impurity region containing an impurity of a second conductivity type, serving as a protection diode, formed in the semiconductor substrate substantially vertically selfaligned with the first side surface of the conductive layer; and a conductive interconnect material electrically connecting the conductive layer and the protection diode.

Another aspect of the present invention is a semiconductor device comprising: a substrate containing an impurity of the first conductivity type; an isolation insulating layer in the semiconductor substrate; a polycrystalline silicon layer, having first and second side surfaces, formed on the isolation insulating layer; an etch stop layer having substantially horizontal portions extending on an upper surface of the polycrystalline silicon layer and on the isolation insulating layer and an arcuate portion curving downwardly along the second side surface of the polycrystalline silicon layer; an ion implanted impurity region containing an impurity of a second conductivity type, serving as a protection diode, formed in the semiconductor substrate substantially vertically selfaligned with the first side surface of the conductive layer; and a conductive interconnect material electrically connecting the polycrystalline silicon layer and the protection diode.

A further aspect of the present invention is a method of manufacturing a semiconductor device, which method comprises: forming an isolation insulating layer in a semiconductor substrate, which semiconductor substrate contains an impurity of the first conductivity type; forming a conductive layer, having first and second side surfaces, extending on the isolation insulating layer; ion implanting an impurity of the second conductivity type to form an impurity region, serving as a protection diode, in the semiconductor substrate substantially vertically self-aligned with the first side surface of the conductive layer; and electrically connecting the conductive layer and the protection diode.

Another aspect of the present invention is a method of manufacturing a semiconductor device, which method comprises: forming an isolation insulating film on a semiconductor substrate, which semiconductor substrate contains an impurity of the first conductivity type; forming a polycrystalline silicon layer, having first and second side surfaces, extending on the isolation insulating layer; forming an etch stop layer having substantially horizontal portions extending on an upper surface of the polycrystalline silicon layer and on the isolation insulating layer and first and second arcuate portions continuous with the substantially horizontal portions and curving downwardly along the first and second side surfaces of the polycrystalline silicon layer, respectively, toward the isolation insulating layer; forming a dielectric interlayer on the etch stop layer; etching through the dielectric interlayer, the first arcuate portion of the etch stop layer on the first side surface of the polycrystalline silicon layer and the isolation insulating layer to form a through hole exposing the semiconductor substrate and substantially vertically self-aligned with the first side surface of the polycrystalline silicon layer; ion implanting an impurity of the second conductivity type to form an impurity region, serving as a protection diode, in the semiconductor substrate substantially vertically self-aligned with the first side surface of the polycrystalline silicon film; and electrically connecting the polycrystalline silicon film and the protection diode.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
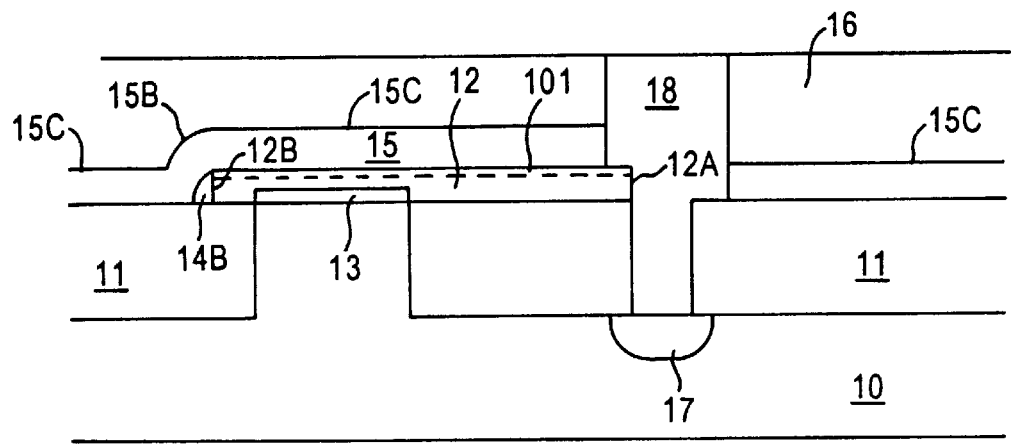
FIG. 1 schematically depicts a semiconductor device in accordance with the present invention containing a self-aligned protection diode.

The present invention addresses the problem of increased layout area attendant upon conventional practices of forming a protection diode to provide a discharge path for electric charging during plasma processing employed throughout various phases in manufacturing semiconductor devices, thereby protecting gate oxide layers, particularly very thin gate oxide layers, such as gate oxide layers having a thickness of about 25 Å to about 300 Å, e.g., 30 Å to about 70 Å. In accordance with the present invention, a self-aligned protection diode is formed in a semiconductor substrate, preferably in unused field areas between devices. The formation of a self-aligned protection diode for in-process device damage prevention in accordance with the present invention requires little or no extra layout area and, hence, results in litle or no increase in the total die size. Accordingly, the self-aligned protection diode of the present invention can be liberally employed throughout the circuit, thereby allowing relaxation of the design rules for the area of metal lines due to in-process charging damage concerns.

In an embodiment of the present invention, a self-aligned protection diode is formed at the first conductive or polycrystalline silicon level in the substrate below a shallow trench isolation insulating layer and is substantially vertically self-aligned with a first side surface of the polycrystalline silicon layer. Such a semiconductor device containing a self-aligned protection diode in accordance with the present invention and corresponding methodology are schematically illustrated in FIGS. 1 through 5, wherein similar elements bear similar reference numerals.

As shown in FIG. 1, the inventive semiconductor device comprises substrate 10 and a shallow isolation insulating layer formed in semiconductor substrate 10 and comprising insulating sections 11, and first conductive layer 12, typically polycrystalline silicon, formed on isolation insulating layer 11 and separated from semiconductor substrate 10 by gate oxide layer 13. Gate oxide layer 13 is formed at any suitable thickness, including at a thickness ranging from about 15 Å to about 300 Å, e.g., 30 Å to about 70 Å, without fear of plasma charging damage.

The inventive semiconductor device is characterized by a sidewall spacer 14B formed on a one side surface of the polycrystalline silicon film 12B and an etch stop layer 15, such as a silicon nitride layer ($Si_3N_4$), a silicon oxynitride or amorphous silicon, formed on polycrystalline silicon layer 12. Self-aligned protection diode 17 is formed under the shallow trench isolation insulating layer 11 and is electrically connected to the polycrystalline silicon layer 12 by conductive interconnect material 18, typically a metal, such as tungsten. Thus, in accordance with this embodiment of the present invention, self-aligned protection diode 17 is in electrical contact with a first side surface 12A and an exposed upper surface of polycrystalline silicon film 12. This embodiment is further characterized by etch stop layer 15 comprising substantially horizontally extending portions 15C and an arcuate portion 15B which exhibits etching characteristics different from horizontal portions 15C, thereby facilitating formation of self-aligned protection diode 17 employing methodology illustrated in FIGS. 2 through 5.

Figure 2:
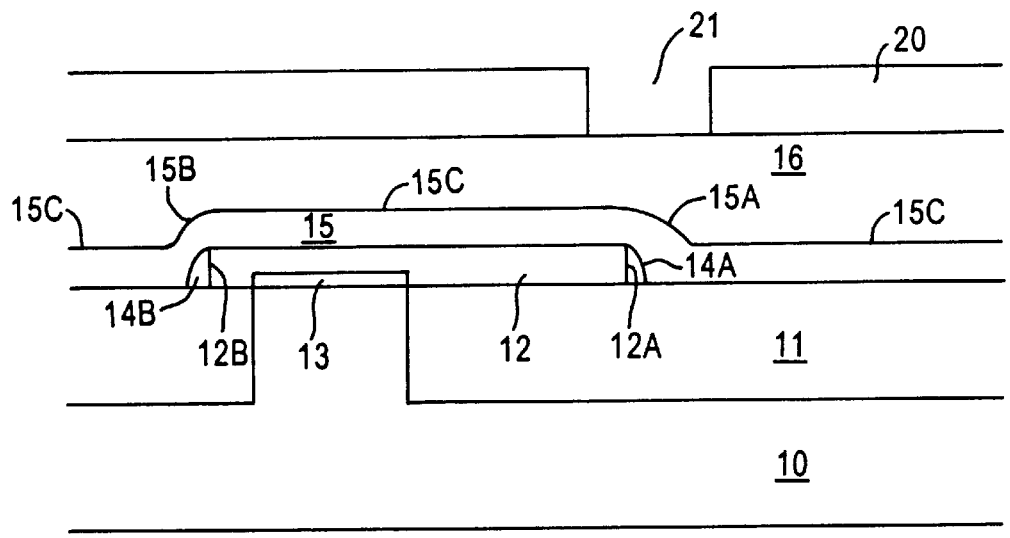
FIGS. 2 through 5 schematically illustrate sequential processing phases in a method manufacturing a semiconductor device in accordance with the present invention.

Adverting to FIG. 2, a shallow trench isolation insulating layer comprising insulating sections 11 is formed in a main surface of semiconductor substrate 10 by conventional isolation techniques, e.g., thermal oxidation, etching followed by oxide deposition, or oxygen implantation. Semiconductor substrate 10 comprises an impurity of a first conductivity type, e.g., P-type impurity. Conductive layer 12, e.g., a polycrystalline silicon layer, is formed on sections of isolation insulating layer sections 11 and on semiconductor substrate 10 with gate oxide layer 13 between polycrystalline silicon layer 12 and semiconductor substrate 10. Polycrystalline silicon layer 12 comprises first and second side surfaces designated 12A and 12B, respectively. First and second insulating sidewall spacers 14A and 14B, respectively, are formed on first and second side surfaces 12A and 12B, respectively.

In accordance with the present invention, etch stop layer 15 is formed on polycrystalline layer 12 and insulating layer 11. Etch stop layer 15 can comprise any of various conventional etch stop materials, including a silicon oxynitride, silicon nitride or amorphous silicon. Etch stop layer 15 comprises arcuate first and second arcuate portions 15A and 15B, respectively, extending along first and second side surfaces 12A and 12B, respectively, of polycrystalline silicon layer 12, with first and second sidewall spacers 14A and 14B, respectively, therebetween. Etch stop layer 15 also comprises essentially horizontally extending portions 15C on an upper surface of polycrystalline silicon layer 12 and insulating layer 11.

Dielectric interlayer 16 is then formed on etch stop layer 15. Dielectric interlayer 16 can comprise any of conventional dielectric materials employed in producing semiconductor devices, such as silicon dioxide. A photoresist mask 20 is then formed on dielectric interlayer 16. Photoresist mask 20 contains an opening 21 which is aligned with first arcuate portion 15A of etch stop layer 15. Arcuate portions 15A and 15B exhibit etching characteristics which are significantly different from those of the substantially horizontally extending portions 15C of etch stop layer 15. Accordingly, an etchant, preferably an anisotropic etchant, is selected with a high selectivity for horizontally extending portions 15C vis-à-vis dielectric interlayer 16 but with a very low selectivity for arcuate portions 15A, 15B vis-à-vis dielectric interlayer 16. The variation of etching characteristics with curvature, e.g., horizontal vis-à-vis arcuate portions, of an etch stop layer is well known and, hence, not elaborated upon herein.

Figure 3:
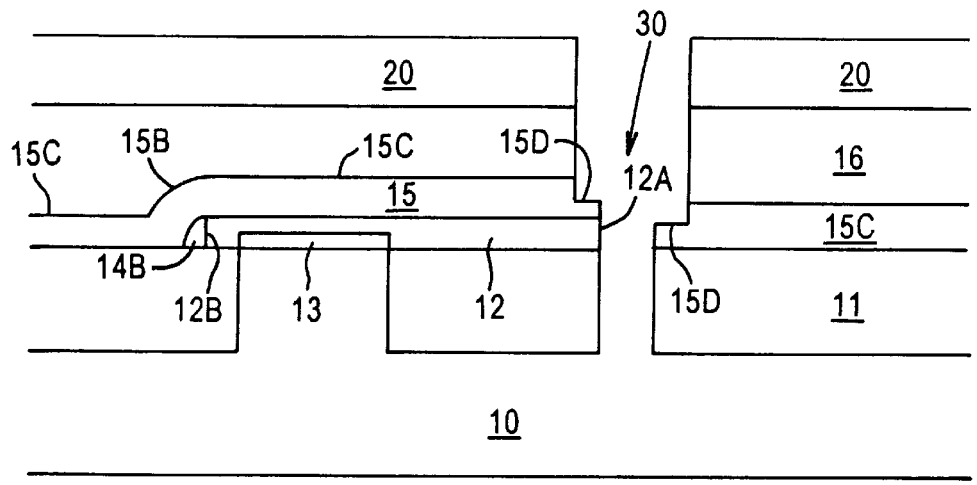

Adverting to FIG. 3, anisotropic etching is conducted to form through hole 30 which extends through dielectric interlayer 16, first arcuate portion 15A of etch stop layer 15, first sidewall spacer 14A, and isolation insulating layer 11, exposing a portion of semiconductor substrate 10 under isolation insulating layer 11. Through hole 30 is vertically self-aligned with first side surface 12A of polycrystalline silicon film 12. Such vertical alignment is achieved by formation of first arcuate portion 15A on first side surface 12A of polycrystalline silicon film 12. Subsequent to anisotropic etching to form through hole 30, portions of etch stop layer 15, designated 15D, are exposed on the upper surface of the isolation insulating layer 11 and on an upper surface of polycrystalline silicon layer 12.

Figure 4:
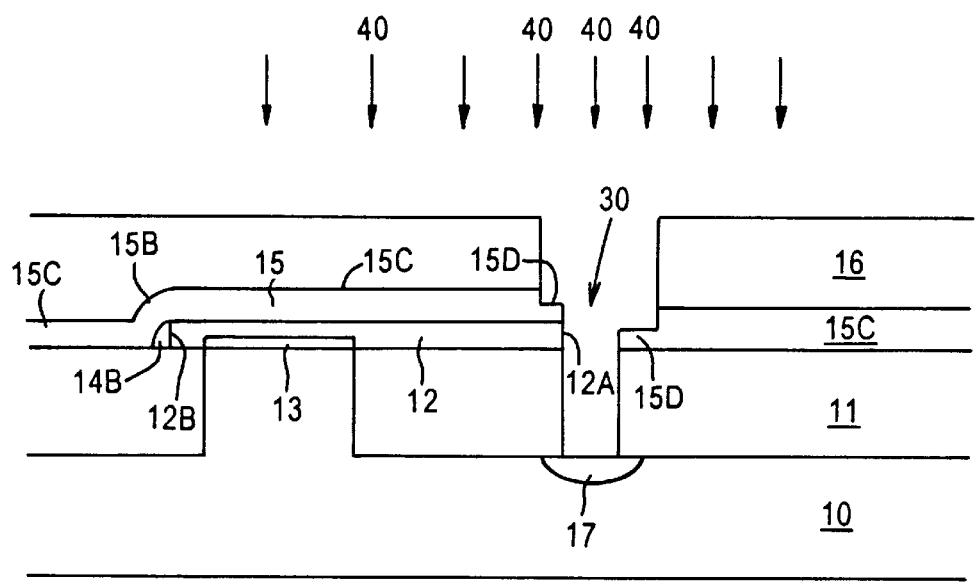

Adverting to FIG. 4, ion implantation is then conducted to implant impurities of a second conductivity type, such as arsenic, to form self-aligned impurity region 17, which serves as a protection diode. In FIG. 4, ion implantation is indicated by arrows 40 through substantially vertically self-aligned through hole 30.

Figure 5:
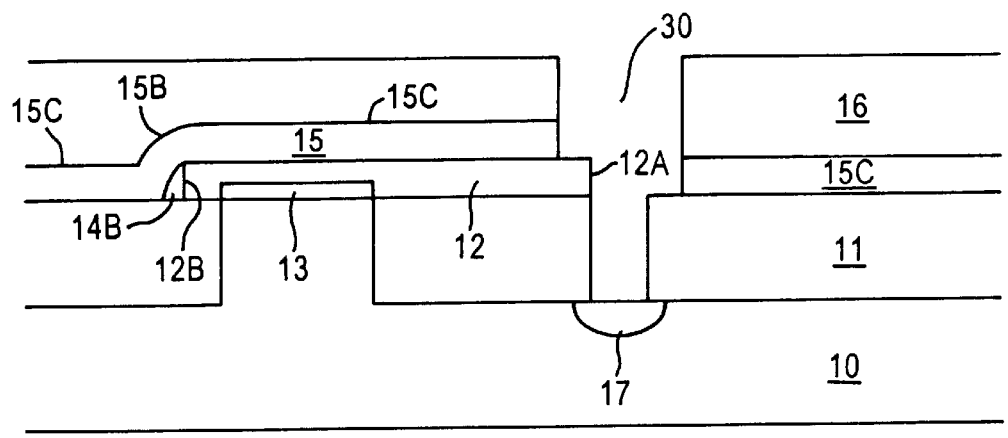
Figure 6:
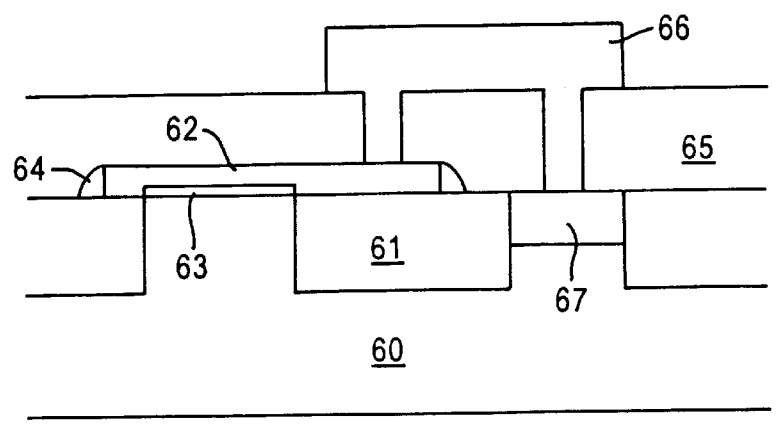
FIG. 6 schematically depicts a conventional semiconductor device containing a protection diode.
Figure 7:
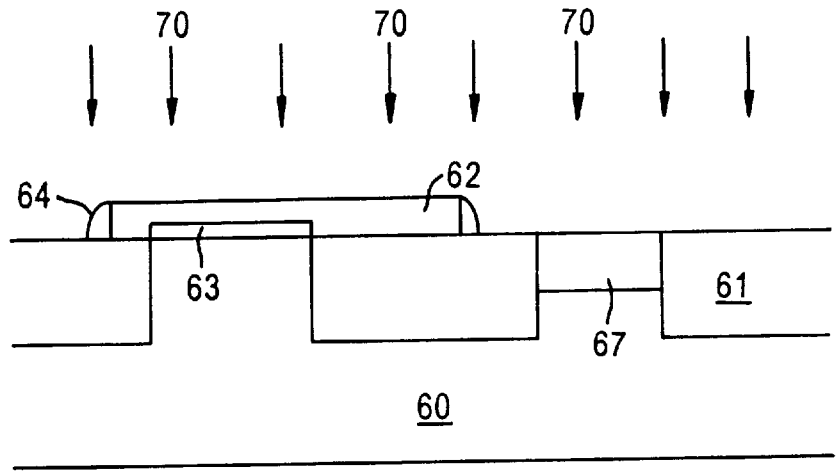
FIGS. 7 and 8 schematically illustrate sequential processing phases in accordance with conventional methodology.
Figure 8:
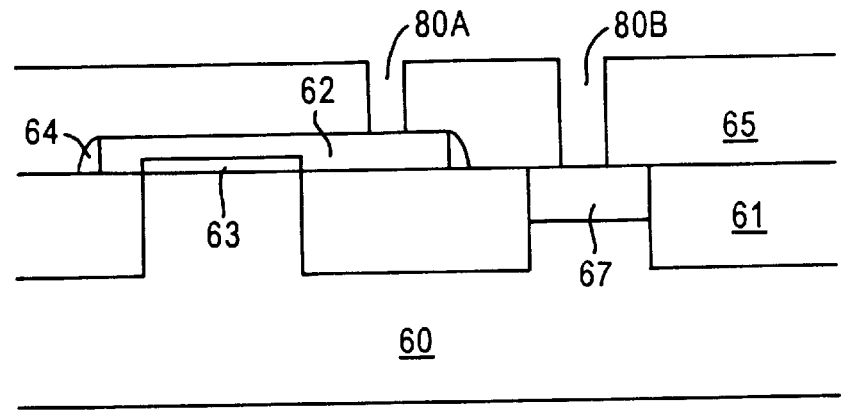

As shown in FIG. 5, etching is conducted to remove exposed etch stop layer portions 15D from the upper surface of isolation insulating layer 11 and from the upper surface of the polycrystalline silicon layer 12. Conductive interconnect material 18, such as a metal, typically tungsten, is then deposited to fill substantially vertically self-aligned through hole 30 to form the structure depicted in FIG. 1, wherein polycrystalline layer 12 is electrically connected to substantially vertically self-aligned protection diode 17.

In another embodiment of the present invention, a metal silicide layer is formed on polycrystalline silicon layer 12, to reduce resistance. The use of a metal silicide layer in semiconductor manufacturing is conventional and, hence, not elaborated upon herein. Conventional metal silicide layers are typically formed by depositing a layer of a refractory metal, such as tungsten or titanium, and heating to effect reaction between the deposited metal and underlying polycrystalline silicon layer 12, thereby forming a metal silicide layer 101 (shown only in FIG. 1 for illustrative simplicity) on the upper surface of polycrystalline layer 12.

After ion implantation to form protection diode 17, heating at an appropriate temperature is conducted to activate the implanted impurity ions of the second conductivity type. For example, after implanting arsenic, boron or phosphorous ions, heating is typically conducted at a temperature of about 450° C. to about 1050° C., to activate the implanted arsenic ions. It has been found suitable to effect heating by rapid thermal annealing.

In another embodiment of the present invention, conductive interconnect material 18, which electrically connects polycrystalline silicon layer to self-aligned protection diode 17 (FIG. 1), is formed by initially depositing a conventional barrier layer, such as tantalum or titanium nitride, and subsequently depositing a metal, such as tungsten, aluminum or copper.

In practicing the present invention, conventional anisotropic etching techniques and etchants can be employed to form through hole 30 and to remove etch stop layer portions 15D. The present invention comprises the use of conventional manufacturing techniques and conventional equipment and, hence, can be easily integrated into existing production facilities. The dielectric and conductive materials employed in the present invention are those conventionally employed in manufacturing semiconductor devices. For example, the dielectric materials include oxides, such as silicon oxide, and nitrides, such as silicon nitrides, as well as silicon oxynitrides. The dielectric layers of the present invention also include conventional dielectric layers of silicon oxide formed by depositing tetraethyl orthosilicate (TEOS), thermolosilicidation of a deposited silicon layer, PECVD, thermo enhanced CVD and spin on techniques. Conductive materials generally include doped polysilicon, aluminum, aluminum alloys, copper, copper alloys, and refractory metals, such as tungsten, titanium, and compounds and alloys thereof. In forming interconnects, conventional barrier layers and anti-reflective coatings can also be employed.

The dielectric layers and metal layers utilized in manufacturing a semiconductor device in accordance with the present invention can be deposited by conventional deposition techniques. For example, metallization techniques, such as various types of chemical vapor deposition (CVD) processes, including low pressure chemical vapor deposition (LPCVP) and enhanced chemical vapor deposition (ECVD) can be employed. Normally, when high melting point metals are deposited, CVP techniques are employed. Low melting point metals, such as aluminum and aluminum-based alloys, including aluminum-copper alloys, can be deposited by melting, reflow or sputtering. Polycrystalline silicon can also be employed as a conductive material in an interconnection pattern.

The present invention advantageously comprises the formation of a self-aligned protection diode formed at the first polycrystalline silicon level with little or no impact on the layout area. Accordingly, the present invention finds particular applicability in satisfying the current demands for high integration, as in VLSI technology. The self-aligned protection diode of the present invention can be liberally employed throughout an integrated circuit, allowing a relaxation of the design rules for the area of metal lines due to in-process charging damage concerns, with little or no impact on design layout.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:

forming an isolation insulating layer in a semiconductor substrate, which semiconductor substrate contains an impurity of the first conductivity type;

forming a conductive polycrystalline silicon layer, having first and second side surfaces, extending on the isolation insulating layer;

forming an etch stop layer having substantially horizontal portions extending on an upper surface of the polycrystalline silicon layer and on the isolation insulating layer, and first and second arcuate portions continuous with the substantially horizontal portions and curving downwardly along first and second side surfaces of the polycrystalline silicon layer, respectively, toward the isolation insulating layer;

forming a dielectric interlayer on the etch stop layer;

etching through the dielectric interlayer, the first arcuate portion of the etch stop layer on the first side surface of the polycrystalline silicon layer and the isolation insulating layer to form a through hole exposing a portion of the semiconductor substrate and substantially vertically self-aligned with the first side surface of the polycrystalline silicon layer;

ion implanting an impurity of the second conductivity type to form an impurity region, serving as a protection diode, in the semiconductor substrate substantially vertically self-aligned with the first side surface of the polycrystalline silicon layer; and electrically connecting the conductive layer and the protection diode.

2. The method according to claim 1, comprising anisotropic etching to form the through hole.

3. The method according to claim 1, comprising forming first and second insulating sidewalls on the first and second side surfaces of the polycrystalline silicon layer, respectively, wherein the first and second arcuate portions of the etch stop layer extend on the first and second insulating sidewalls, respectively.

4. The method according to claim 3, comprising etching through the first insulating sidewall in forming the through hole.

5. The method according to claim 1, further comprising forming a metal silicide layer on an upper surface of the polycrystalline silicon layer; wherein a substantially horizontal portion of the etch stop layer extends on the metal silicide layer.

6. The method according to claim 1, wherein the etch stop layer comprises a silicon nitride or a silicon oxynitride layer.

7. The method according to claim 1, wherein the polycrystalline silicon layer comprises a word line.

8. The method according to claim 1, wherein the polycrystalline silicon layer comprises a gate electrode extending on the semiconductor substrate with a gate oxide layer therebetween, the gate oxide layer having a thickness of about 15 Å to about 300 Å.

9. The method according to claim 8, wherein the gate oxide layer has a thickness of about 30 Å to about 70 Å.

10. The method according to claim 1, further comprising heating at a temperature of about 450° C. to about 1050° C. to activate the implanted impurity ions of the second conductivity type.

11. The method according to claim 10, comprising heating by rapid thermal annealing.

12. The method according to claim 11, wherein the impurity of the second conductivity type is arsenic, boron, or phosphorous and heating activates the doped impurity region.

13. The method according to claim 1, wherein segments of the substantially horizontal portions of the etch stop layer on the isolation insulating layer and polycrystalline silicon layer are exposed in the through hole, which method further comprises etching to remove the exposed segments of the etch stop layers.

14. The method according to claim 13, comprising depositing a metal in the through hole to electrically connect the first side surface and a portion of the upper surface of the polycrystalline silicon layer and the protection diode.

15. The method according to claim 14, wherein the metal comprises aluminum.

16. The method according to claim 14, comprising:

depositing a barrier layer in the through hole; and depositing a metal in the through hole to form the self-aligned electrical interconnection between the polycrystalline silicon layer and the protection diode.

17. The method according to claim 16, wherein the barrier layer comprises titanium nitride and the metal comprises tungsten.

18. The method according to claim 16, wherein the barrier layer comprises tantalum and the metal comprises copper.

* * * * *